(12) United States Patent
Greep et al.

(10) Patent No.: US 12,152,884 B2
(45) Date of Patent: Nov. 26, 2024

(54) SYNCHRONOUS TIMING TO MEMS RESONANT FREQUENCY

(71) Applicant: Atlantic Inertial Systems Limited, Plymouth (GB)

(72) Inventors: Luke Greep, Plymouth (GB); Kevin Townsend, Liskeard (GB); Michael Durston, Plymouth (GB)

(73) Assignee: ATLANTIC INERTIAL SYSTEMS LIMITED, Plymouth (GB)

( * ) Notice: Subject to any disclaimer, the term of this patent is extended or adjusted under 35 U.S.C. 154(b) by 210 days.

(21) Appl. No.: 17/736,484

(22) Filed: May 4, 2022

(65) Prior Publication Data

US 2022/0364863 A1 Nov. 17, 2022

(30) Foreign Application Priority Data

May 11, 2021 (EP) .................................... 21275057

(51) Int. Cl.
*G01C 19/5776* (2012.01)
*G01C 19/5684* (2012.01)
(Continued)

(52) U.S. Cl.
CPC ..... *G01C 19/5776* (2013.01); *G01C 19/5684* (2013.01); *G01D 5/243* (2013.01);
(Continued)

(58) Field of Classification Search
CPC ..... G01C 19/5776; H03L 7/099; H03L 7/085; H03M 1/001; G01D 5/243
(Continued)

(56) References Cited

U.S. PATENT DOCUMENTS

| 9,374,069 B2 | 6/2016 | Townsend |
| 2010/0212424 A1 | 8/2010 | Malvern et al. |

(Continued)

FOREIGN PATENT DOCUMENTS

| CN | 108020240 A | 5/2018 |
| CN | 112468148 A | 3/2021 |

(Continued)

OTHER PUBLICATIONS

Abstract for CN108020240 (A), Published: May 11, 2018, 1 Page.

(Continued)

*Primary Examiner* — Arnold M Kinkead
(74) *Attorney, Agent, or Firm* — CANTOR COLBURN LLP

(57) ABSTRACT

A signal processing system for a sensor. The system comprises a digital signal processing system configured to set a drive signal frequency for the primary drive transducer, a voltage controlled oscillator configured to receive an input indicative of the resonant frequency and to generate a first periodic signal at a first multiple of the resonant frequency, and a first phase locked loop, configured to receive the first periodic signal, and to generate a second periodic signal at a second multiple of the resonant frequency. The first and second periodic signals are used to control the operation of an analog-to-digital converter (ADC) configured to sample the primary pick off signal and a digital-to-analog converter (DAC) configured to generate a drive signal waveform applied to the primary drive transducer.

13 Claims, 6 Drawing Sheets

(51) Int. Cl.
  *G01D 5/243* (2006.01)
  *H03L 7/085* (2006.01)
  *H03L 7/099* (2006.01)
  *H03M 1/00* (2006.01)

(52) U.S. Cl.
  CPC .............. *H03L 7/099* (2013.01); *H03L 7/085* (2013.01); *H03M 1/001* (2013.01)

(58) Field of Classification Search
  USPC ....... 331/1 R, 154, 116 M, 116 R; 73/504.12
  See application file for complete search history.

(56) References Cited

U.S. PATENT DOCUMENTS

| | | |
|---|---|---|
| 2011/0179868 A1 | 7/2011 | Kaino et al. |
| 2016/0003618 A1* | 1/2016 | Boser ..................... G01D 5/243 |
| | | 73/504.12 |
| 2018/0164125 A1 | 6/2018 | Dakshinamurthy et al. |
| 2018/0278259 A1 | 9/2018 | Ii et al. |
| 2019/0145773 A1* | 5/2019 | Collin ................ G01C 19/5776 |
| | | 73/504.12 |
| 2021/0033399 A1 | 2/2021 | Sheard et al. |

FOREIGN PATENT DOCUMENTS

| | | | |
|---|---|---|---|
| EP | 1015849 B1 | 12/2001 | |
| JP | 2010034722 A | 2/2010 | |
| WO | WO-2011107542 A2 * | 9/2011 | ......... G01C 19/5684 |

OTHER PUBLICATIONS

Abstract for CN112468148 (A), Published: Mar. 9, 2021, 1 Page.
European Search Report for Application No. 21275057.4, mailed Oct. 15, 2021, 5 pages.
Abstract of JP2010034722 (A), Published: Feb. 12, 2010, 1 page.
English Translation of JP Office Action for Patent Application No. JP 2022-077293, mailed Aug. 8, 2023, 1 page.
JP Office Action for Patent Application No. JP 2022-077293, mailed Aug. 8, 2023, 2 pages.

* cited by examiner

SYNCHRONOUS TIMING TO MEMS RESONANT FREQUENCY

CROSS-REFERENCE TO RELATED APPLICATIONS

This application claims priority to European Patent Application No. 21275057.4 filed May 11, 2021, the entire contents of which is incorporated herein by reference.

TECHNICAL FIELD

The present disclosure generally relates to timing control for vibrating structure gyroscopes and angular rate sensors and, more specifically, to a signal processing system for a vibrating structure gyroscope.

BACKGROUND

In many applications, vibrating structure angular rate sensors (also known as gyroscopes) are constructed using Micro-Electro-Mechanical Systems (MEMS) techniques, in which a device is fabricated from a silicon wafer, which may be bonded to a glass substrate wafer or alternatively sandwiched between two glass substrate layers.

Coriolis-type MEMS gyroscopes, which utilise vibrating structures in the form of planar silicon ring resonators, are among the best performing devices in terms of bias and overall stability. As the performance of MEMS gyroscopes improves, they are increasingly being used in more demanding applications to replace more expensive and larger devices such as fibre optic or spinning mass gyroscopes. However, the performance of MEMS gyroscopes is still limited by the time and temperature stability of the resonant frequency of the MEMS resonator. Variations in the resonant frequency of MEMS gyroscopes can lead to errors during measurement of the output signal, the timing of which is typically set using an oscillator of fixed frequency. As the MEMS resonant frequency varies with temperature, the point at which the output signal is sampled in each cycle is shifted, leading to bias shifts in the measured signal due to phase errors caused by misaligned sampling points.

There remains a need to reduce timing errors caused by variations in the MEMS resonant frequency with temperature.

SUMMARY

According to a first aspect of this disclosure, there is provided a signal processing system for a vibrating structure angular rate sensor. The sensor includes a vibrating structure, a primary drive transducer for causing the vibrating structure angular rate sensor to oscillate at a resonant frequency, and a primary pick off transducer for detecting oscillation of the vibrating structure angular rate sensor at the resonant frequency. The system includes: a digital signal processing system configured to set a drive signal frequency for the primary drive transducer; a voltage controlled oscillator (VCO) configured to receive an input indicative of the resonant frequency and to generate a first periodic signal at a first multiple of the resonant frequency; a first phase locked loop, configured to receive the first periodic signal, and to generate a second periodic signal at a second multiple of the resonant frequency, wherein the second multiple is greater than the first multiple; an analog-to-digital converter (ADC) configured to sample a primary pick off signal from the primary pick off transducer at a first rate set by the first periodic signal and to generate a primary pick off data input to a digital signal processing system, wherein the second periodic signal is used as a clock signal by the ADC when generating the primary pick off data input to the digital signal processing system; and a digital-to-analog converter (DAC) configured to receive the drive signal frequency from the digital signal processing system at a second rate set by the second periodic signal and to generate a drive signal waveform to be applied to the primary drive transducer, wherein the drive signal waveform is generated at a first rate set by the first periodic signal and the second periodic signal is used as a clock signal by the DAC when generating the drive signal waveform.

In such a signal processing system, the voltage controlled oscillator (VCO) may be used to establish the base timing for pick off and drive operations. It will be appreciated that deriving the clock signals and sampling rates of the signal processing system directly from the resonant frequency of the vibrating structure angular rate sensor detected at the primary pickoff transducer allows all signal processing to be synchronous to the resonant frequency of the vibrating structure angular rate sensor. In this way, any variations in the resonant frequency (e.g. as a result of temperature changes) are automatically accounted for during sampling, such that phase errors caused by misaligned sampling points can be avoided. By way of contrast, previous implementations have used an external oscillator to derive the base timings for sampling the primary pick off signal but this does not account for the resonant frequency varying with temperature. This can result in large bias shifts in the gyroscope output due to phase errors.

A benefit of the first periodic signal having a lower frequency than the second periodic signal is less jitter and lower noise when used as a clock signal for the critical tasks of accurately sampling the primary pick off signal at the ADC and updating the DAC for generating the drive signal waveform. The DAC is updated at a similar rate to the ADC, i.e. at the second rate set by the second periodic signal.

In accordance with one or more examples of this disclosure, the signal processing system further comprises a second phase locked loop, configured to receive the second periodic signal and to generate a third periodic signal at a third multiple of the resonant frequency, wherein the third multiple is greater than the second multiple. In at least some examples, the third periodic signal is used as a clock signal by the digital signal processing system during computation to set the drive signal frequency synchronously with the resonant frequency. This ensures that the digital signal processing system has sufficient processing cycles to be able to compute the required drive signals from the pickoff samples within a cycle at the resonant frequency. This can prevent any asynchronous signals/noise from corrupting the accuracy of the signals from the pickoff transducers.

The third periodic signal being used as a clock enables the digital signal processing system to do its complex calculations based on the pickoff signals to set the drive signal frequency, at a faster rate than the second rate. A benefit of the third periodic signal having a higher frequency than the second periodic signal is that the clock signal used by the digital signal processing system is higher frequency when analysing the primary pick off data, while remaining synchronous with the resonant frequency.

In accordance with one or more examples of this disclosure, the digital signal processing system is configured to set a secondary drive signal frequency for a secondary drive signal to be applied to a secondary drive transducer by a second digital-to-analog converter (DAC). In such examples, the second digital-to-analog converter (DAC) is configured to receive the secondary drive signal frequency from the digital signal processing system at the second rate set by the second periodic signal and to generate a secondary drive signal waveform to be applied to the secondary drive transducer, wherein the secondary drive signal waveform is generated at the first rate set by the first periodic signal and the second periodic signal is used as a clock signal by the second DAC when generating the secondary drive signal waveform. This allows for closed loop operation that is also synchronous with the resonant frequency.

In accordance with one or more examples of this disclosure, the primary pick off data input to the digital signal processing system is used to provide the input indicative of the resonant frequency from the digital signal processing system to the voltage controlled oscillator based on comparing the resonant frequency with the first periodic signal. Based on this comparison, the input indicative of the resonant frequency may be adjusted in order to ensure that the frequency of the first periodic signal generated by the VCO remains synchronous to the resonant frequency of the vibrating structure angular rate sensor. In this way, sampling times and clock signals based on the first periodic signal are updated as the resonant frequency varies. This ensures that the signal processing system remains synchronous to the resonant frequency of the vibrating structure angular rate sensor. In some examples, the digital signal processing system may provide the input indicative of the resonant frequency from the digital signal processing system to the voltage controlled oscillator based on comparing the resonant frequency to the second and/or third periodic signals in place of the first periodic signal. These examples are suited to a digital implementation of the signal processing system.

In accordance with one or more examples of this disclosure, the signal processing system may comprise a loop filter (e.g. analogue loop filter) configured to receive the primary pick off signal at the resonant frequency from the primary pick off transducer and the first periodic signal from the VCO, and to provide the input indicative of the resonant frequency to the VCO based on comparing the resonant frequency with the first periodic signal. The loop filter may provide the input indicative of the resonant frequency to ensure that the frequency of the first periodic signal generated by the VCO remains synchronous to the resonant frequency of the vibrating structure angular rate sensor. These examples are suited to an analogue implementation of the signal processing system.

The signal processing system disclosed herein may include any suitable combination of analogue and digital components. In some examples the voltage controlled oscillator is digitally controlled. In some examples it is envisaged that the first phase locked loop is implemented as an analogue circuit. In various examples the first phase locked loop (PLL) is implemented as a combination of hardware and software, for example by an application specific circuit (ASIC) or other configurable circuit such as a field programmable gate array (FPGA). A FPGA may be chosen as a convenient implementation which can assist with generating the second periodic signal that is used as a clock signal by the DAC when generating the drive signal waveform.

In one or more examples of the disclosure, the signal processing system comprises a field programmable gate array (FPGA) comprising the first phase locked loop, and the second periodic signal is used as a clock signal by the FPGA. In such examples the FPGA may be used to establish the base timing for pick off and drive operations of the signal processing system. The FPGA may use the second periodic signal generated by the first phase locked loop as a clock signal, such that the clock signal of the FPGA is synchronous to the resonant frequency of the vibrating structure angular rate sensor.

In some examples in which the signal processing system comprises a FPGA, the FPGA may comprise a counter having a maximum value, and the increment rate of the counter may be synchronous with the resonant frequency of the vibrating structure angular rate sensor. The increment rate of the counter of the FPGA may be set to be synchronous to the resonant frequency of the vibrating structure angular rate sensor such that it is able to compensate for any deviations in resonant frequency that occur, for example as a result of temperature changes. The counter may increment with each clock cycle of the FPGA. The maximum value of the counter of the FPGA may be set to be equal to the value of the first multiple of the resonant frequency generated by the voltage controlled oscillator. For example, if the voltage controlled oscillator generates a first periodic signal at ninety six times the resonant frequency, the maximum value of the counter may be equal to ninety six. In such examples, the counter of the FPGA may be configured to roll over after the maximum value of increments is reached so that the sampling sequence is repeated. This may trigger the primary pick off data to be input from the analog to digital converter to the digital signal processing system and the new data from the digital signal processing system to update the DACs.

In one or more examples of the disclosure, the signal processing system comprises a multiplier (e.g. a doubler) configured to multiply (e.g. double) the frequency of the first periodic signal before being received by the first phase locked loop. The multiplier may receive the first periodic signal from the voltage controlled oscillator, and may generate an intermediate periodic signal at a predetermined multiple of the frequency of the first periodic signal. The first phase locked loop may receive the intermediate signal in place of the first periodic signal. In one or more examples, the multiplier may be a doubler comprising an exclusive-or (EX-OR) logic gate. Multiplying the frequency of the first periodic signal before it is provided to the first phase locked loop (PLL) may advantageously allow phase locked loops with higher minimum locking frequencies to be implemented in the signal processing system. For example, it has been found that a FPGA may require a minimum frequency (e.g. 1.5 MHz) for the PLL to lock. This may allow higher clock rates to be achieved while still remaining synchronous to the resonant frequency of the vibrating structure angular rate sensor.

In one or more examples of the disclosure, the signal processing system comprises a divider configured to reduce the frequency of the second periodic signal before being applied by the analog-to-digital converter (ADC) when sampling the primary pick off signal from the primary pick off transducer. The divider may receive a signal at the second periodic frequency from the first phase locked loop, and may output a signal at a lower frequency to the ADC. This may allow lower sampling rates to be used by the ADC than the rate set by the second periodic signal, while still allowing sufficient data to be captured in order to identify at least the fundamental signal at the resonant frequency as well as a desired number (e.g. three) of the lowest frequency harmonics of the fundamental signal. As the divider is configured to output a signal at a factor of the frequency of the second periodic signal, the signal received by the ADC and used to sample the pickoff signal remains synchronous to the resonant frequency.

In one or more examples of the disclosure, the signal processing system comprises a divider configured to reduce the frequency of the second periodic signal before being applied by the digital-to-analog converter (DAC) when generating the drive signal waveform to be applied to the primary drive transducer. The divider may receive a signal at the second periodic frequency from the first phase locked loop, and may output a signal at a lower frequency to the DAC. This may allow the DAC to generate a drive signal waveform at a lower rate than that set by the second periodic signal. As the divider is configured to output a signal at a factor of the frequency of the second periodic signal, the signal received by the DAC and used in the generation of the drive signal waveform remains synchronous to the resonant frequency. The signal received by the DAC may be arranged to be interleaved with the ADC samples to prevent the accuracy of the ADC measurement from becoming corrupted.

In one or more examples of the disclosure, the signal processing system can be operated in different modes. In at least some examples: in a first mode of operation, the first phase locked loop is connected to an external oscillator so as to verify the frequency of the received first periodic signal; and in a second mode of operation, the first phase locked loop is disconnected from the external oscillator. The first mode of operation may be an initial mode of operation that allows the first phase locked loop to verify i.e. check the incoming frequency of the first periodic signal from the voltage controlled oscillator against the external oscillator. The second mode of operation may be used after the first mode of operation. In the second mode of operation, the first phase locked loop is disconnected from the external oscillator as the system effectively switches to using the timing of the second periodic signal generated by the first phase locked loop, i.e. the system is now synchronous to the resonant frequency. In at least some examples, the external oscillator is disabled to remove any unnecessary noise in the system.

There is also disclosed herein a method of initialising a signal processing system as disclosed above. In an initial setup process using the first mode of operation described above, the frequency of the first periodic signal is verified by the first phase locked loop (PLL) against an external oscillator. The first mode of operation may be used for initialisation or diagnostic purposes. Once the first PLL is locked, the external oscillator is disconnected in the second mode of operation since the system is now synchronous with the resonant frequency. The second mode of operation may be the normal mode of operation during use of the vibrating structure angular rate sensor.

This disclosure extends to a vibrating structure angular rate sensor comprising a signal processing system as disclosed herein. In one or more examples of the disclosure, the vibrating structure angular rate sensor is a MEMS sensor. In one or more examples of the disclosure, the vibrating structure angular rate sensor comprises a MEMS ring resonator structure comprising a planar ring supported by compliant supporting structures, which allow the planar ring to move elastically when deformed by an applied force.

It should be appreciated that the vibrating structure angular rate sensor may comprise any suitable number of primary drive transducers and primary pick-off transducers. In some examples therefore, the primary drive transducer and primary pick off transducer may be replaced by a pair of primary drive transducers and a pair of primary pick off transducers respectively.

In one or more examples of the disclosure, the vibrating structure angular rate sensor comprises a secondary pick off transducer for detecting oscillation of the vibrating structure angular rate sensor in a secondary mode of oscillation induced by Coriolis force when an angular rate is applied around an axis of rotation of the vibrating structure angular rate sensor. In some such examples, the signal processing system may further comprise a second analog-to-digital converter (ADC) configured to sample a secondary pick off signal from the secondary pick off transducer at a first rate set by the first periodic signal and to generate a secondary pickoff data input to a digital signal processing system, wherein the second periodic signal is used as a clock signal by the second ADC when generating the secondary pickoff data input to the digital signal processing system, and the digital signal processing system may be configured to determine an angular rate of the vibrating structure angular rate sensor based on the secondary pickoff data input.

In some examples in which the vibrating structure angular rate sensor comprises a secondary pick off transducer, the signal processing system further comprises a secondary drive transducer, arranged to null oscillation of the vibrating structure angular rate sensor in the secondary mode. In some such examples, the digital signal processing system is configured to set a nulling amplitude at the signal frequency for the secondary drive transducer, and the signal processing system may further comprise a second digital-to-analog converter (DAC) configured to receive the nulling signal from the digital signal processing system at the second rate set by the second periodic signal and to generate a nulling signal waveform to be applied to the secondary drive transducer, wherein the nulling signal waveform is generated at a first rate set by the first periodic signal and the second periodic signal is used as a clock signal by the second (DAC) when generating the nulling signal waveform.

In examples comprising secondary pickoff and/or secondary drive transducers, the vibrating structure angular rate sensor may comprise any suitable number of secondary drive transducers and secondary pick-off transducers. In some examples therefore, the secondary drive transducer and secondary pick off transducer may be replaced by a pair of secondary drive transducers and a pair of secondary pick off transducers respectively. In some examples, one of the secondary drive transducers is configured as an additional secondary pickoff transducer. This may advantageously result in an improved signal to noise ratio.

Features of any aspect or embodiment described herein may, wherever appropriate, be applied to any other aspect or embodiment described herein. Where reference is made to different embodiments or sets of embodiments, it should be understood that these are not necessarily distinct but may overlap.

BRIEF DESCRIPTION OF THE DRAWINGS

Certain exemplary embodiments of this disclosure will now be described, with reference to the accompanying drawings, in which.

DETAILED DESCRIPTION

Figure 1:
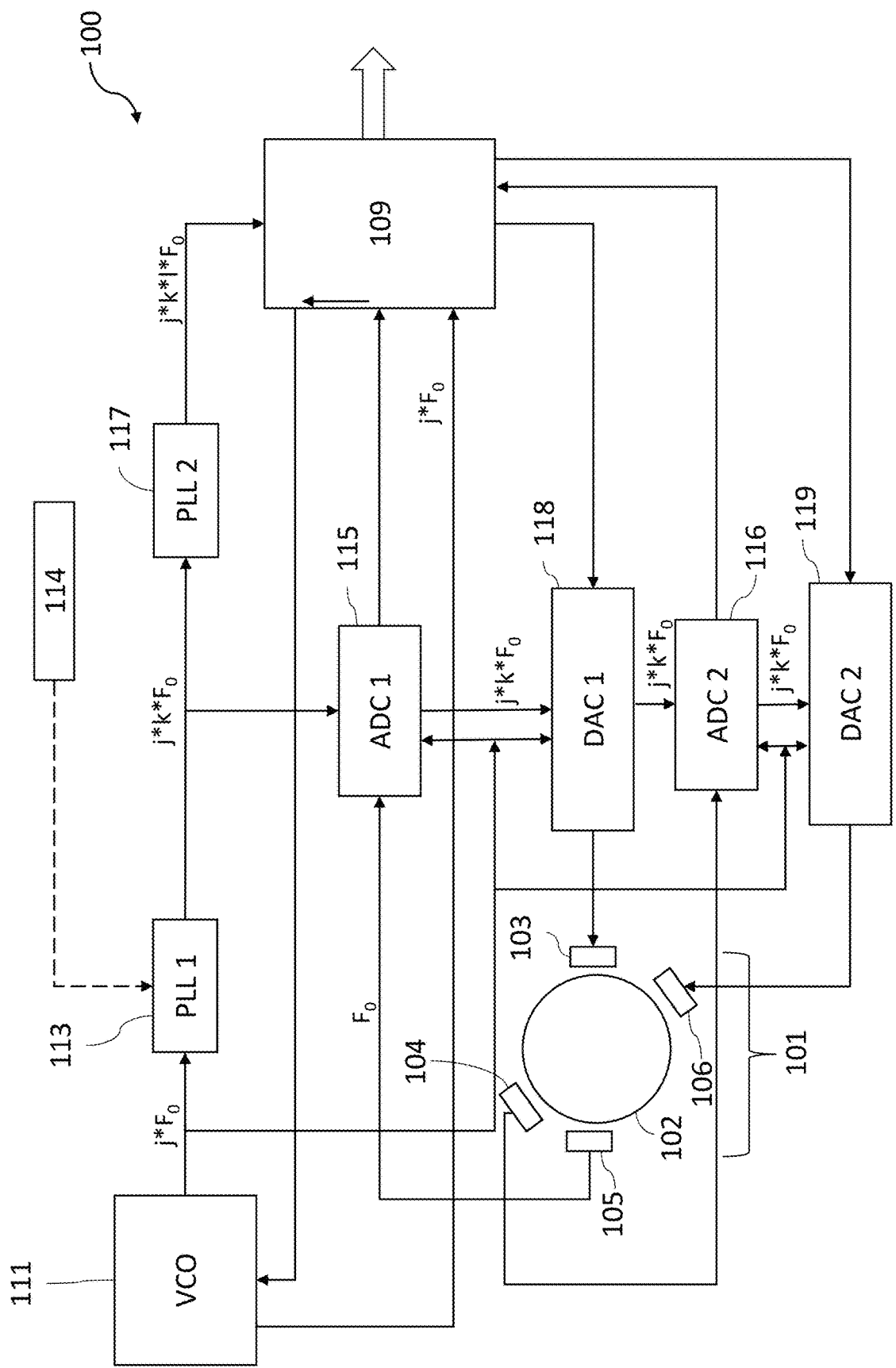
FIG. 1 schematically illustrates a signal processing system for a closed loop vibrating structure angular rate sensor according to a first example of the present disclosure.

FIG. 1—Closed Loop—Digital Signal Processing

FIG. 1 shows a signal processing system 100 for a vibrating structure angular rate sensor 101 according to a first example of the present disclosure implementing closed loop operation.

The vibrating structure angular rate sensor 101 comprises a vibrating structure 102, which is driven to oscillate at its natural resonant frequency by a primary drive (PD) transducer 103. In the example shown in FIG. 1, the vibrating structure 102 is a ring resonator structure comprising a planar ring supported by compliant supporting structures, which allow the planar ring to move elastically when deformed by an applied force. However it will be appreciated that the signal processing system 100 is equally applicable to other vibrating structures, such as beams, tuning forks, cylinders, hemispherical shells. Oscillations of the vibrating structure 102 at the resonant frequency are detected by a primary pick off (PPO) transducer 105. The detected signals are processed using the digital signal processing system 109, and, based on this processing, the primary drive signals are adjusted by the signal processing system 100 to maintain resonant motion of the vibrating structure 102 as will be described in the following.

When the vibrating structure angular rate sensor 101 is rotated around an axis of rotation of the vibrating structure 102, Coriolis forces couple energy into a secondary mode of vibration of the vibrating structure 102, with the amplitude of the vibration in the secondary mode being proportional to the applied angular rate. Such Coriolis-induced vibration is detected using a secondary pick off (SPO) transducer 104, and signals from the SPO transducer 104 representative of the applied angular rate are processed by the digital signal processing system 109 to calculate the rate of angular motion experienced by the vibrating structure angular rate sensor 101. In the closed loop system shown in FIG. 1, the secondary pick off signals are also processed by the signal processing system 100 to generate secondary drive signals, which are applied to the vibrating structure 102 by a secondary drive transducer 106 to null the induced oscillation of the vibrating structure 102 in the secondary mode.

The signal processing system 100 shown in FIG. 1 includes a voltage controlled oscillator (VCO) 111, a first phase locked loop (PLL) 113, a second phase locked loop 117, and first and second analogue to digital converters (ADC) 115 and 116, used to sample and convert signals detected by the primary pick off transducer 105 and the secondary pickoff transducer 104 respectively into primary drive data and secondary drive data. The signal processing system 100 also includes a digital signal processing (DSP) system 109 configured to process the primary and secondary pickoff data from the analogue to digital converters 115 and 116, and to generate primary and secondary drive data.

Primary and secondary drive data generated by the digital signal processing system 109 is output to first and second digital to analogue converters (DAC) 118 and 119. Based on this data, the first and second digital to analogue converters 118 and 119 generate the drive signals provided to the primary drive transducer 103 to maintain resonant motion of the vibrating structure 102, and the nulling signals provided to the secondary drive transducer 106 to null any induced oscillation of the vibrating structure 102 in the secondary mode.

In operation, the digital signal processing system 109 generates a drive signal at a resonant frequency F0 of the vibrating structure 102. This drive signal may initially be set using a clock signal provided by an external oscillator 114, but once operational, the clock signal on which the drive signal is based is generated using the resonant frequency measured at the primary pick off transducer 105 as described in the following. The drive signal is provided to the first digital to analogue converter 118, where it is used to generate a drive waveform which is passed to the primary drive transducer 103 to excite the vibrating structure 102 to oscillate at the resonant frequency F0 (e.g. 12 KHz).

Oscillations of the vibrating structure 102 are detected at the primary pick off transducer 105, resulting in the generation of an analogue signal which is input to the first analogue to digital converter 115. The analogue to digital converter 115 samples the signal from the primary pickoff transducer 105 at a rate greater than the resonant frequency, with the sampling rate chosen in this example such that sufficient data points are captured in order to identify at least the fundamental signal and the three lowest frequency harmonics of the resonant frequency.

The sampling rate used by the first ADC 115 (as well as the second ADC 116) is set by the voltage controlled oscillator 111 as will be described below. The sampled signal, representative of the movement of the vibrating structure 102, is output from the ADC 115 to the digital signal processing system 109 in the form of primary pick off data. This data is processed by the digital signal processing system 109 in order to generate the required primary drive signal to keep the vibrating structure 102 in resonance. This is achieved by ensuring that an appropriate phase shift between the primary drive signal and the primary pick off signal is maintained. The phase shift between the primary drive signal and the primary pick off signal may be 0, 90, 180 or 270 degrees depending on the orientation and position of the primary drive transducer 103 and the primary pickoff transducer 105, and/or on the configuration of the primary pickoff transducer 105. The primary pick off data is also used to generate a plurality of clock signals for the signal processing system 100 as will be described in the following.

Based on the primary pick off data, the digital signal processing system 109 provides a signal indicative of the resonant frequency to the voltage controlled oscillator 111, which generates a first periodic signal at a first multiple j of the resonant frequency F0 (e.g. ninety six times the resonant frequency).

The first periodic signal is provided to the first ADC 115 and the second ADC 116 and is used to set the rate at which signals are sampled from the primary and secondary pickoff transducers 105, 104 respectively, as well as the rate at which the primary and secondary pick off data is output to the digital signal processing system 109. The first periodic signal is also provided to the first DAC 118 and the second DAC 119 to set the rate at which the drive signal waveforms for the primary drive transducer 103 and secondary drive transducer 106 are generated. In addition, the first periodic signal is used to generate clock signals for the signal processing system 100 as will be described in the following.

The first periodic signal is output from the VCO 111 to the first phase locked loop 113 which generates a second periodic signal at a multiple k of the frequency of first periodic signal, i.e. at a frequency j*k*F0 (where k is e.g. sixteen). On initialisation of the signal processing system 100, the frequency of the first periodic signal may be verified by checking the frequency of the first periodic signal from the voltage controlled oscillator 111 against a verification signal from the external oscillator 114. Once the frequency of the first periodic signal has been verified, the external oscillator 114 is disconnected from the first phase locked loop 113, and disabled to remove any unnecessary noise in the system. The signal processing system 111 then switches to using timing based on the second periodic signal. To achieve this, the second periodic signal is provided as an input to the first and second ADCs 115, 116 and the first and second DACs 118 and 119, which use the second periodic signal as a clock signal.

Employing the second periodic signal in this manner allows sampling of the pickoff signals, and generation of the drive signals, to be carried out at a rate synchronous to the resonant frequency of the vibrating structure 102. In this way, if the resonant frequency of the vibrating structure 102 changes, for example as a result of a change in temperature, so too do the timings at which pickoff signals are sampled. Any variation in resonant frequency due to temperature can therefore be cancelled out, reducing phase errors in sampling and improving bias performance of the signal processing system 100.

The signal from the first PLL 113 is also passed to a second PLL 117, which generates a third periodic signal at a multiple l of the frequency of second periodic signal, i.e. at a frequency j*k*l*F0 (where l is e.g. five). The third periodic signal is provided as an input to the digital signal processing system 109, where it is used as a clock signal by the digital signal processing system 109. As the third periodic signal is generated based on the resonant frequency measured by the primary pickoff transducer 105, the primary drive signal can also be generated synchronously with the resonant frequency. Generating the clock signal for the digital signal processing system 109 in this way also removes the need for an external oscillator as would typically be employed in prior art signal processing systems.

Figure 2:
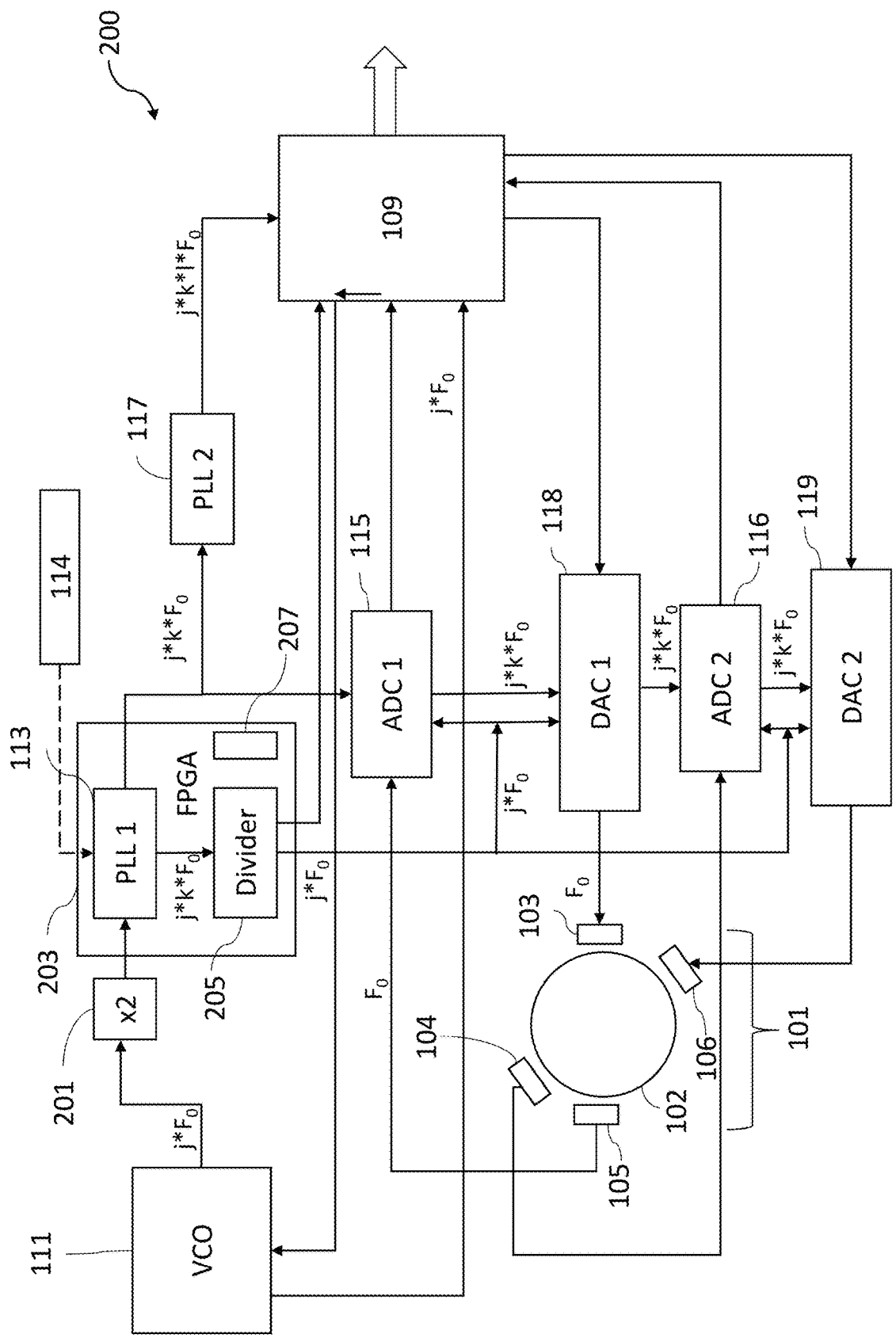
FIG. 2 schematically illustrates a signal processing system for a closed loop vibrating structure angular rate sensor according to a second example of the present disclosure, comprising a field programmable gate array.

FIG. 2—Closed Loop—Digital Signal Processing Including FPGA, Dividers and Doubler In some embodiments, the signal processing system may include additional hardware in order to accommodate the requirements of certain commercial components, such as phase locked loops, which may have a minimum input frequency.

FIG. 2 shows an example of a signal processing system 200 including additional hardware components as will be described in the following. As can be seen in FIG. 2, the signal processing system 200 includes all of the components of the signal processing system 100 shown in FIG. 1, with the addition of a multiplier 201, and a field programmable gate array (FPGA) 203 comprising the first phase locked loop 113, and a divider 205. Insofar as FIG. 2 includes items previously discussed in connection with FIG. 1, the similar items will be given the same reference numbers and not described in detail.

In contrast to the signal processing system 100 shown in FIG. 1, in the signal processing system 200 shown in FIG. 2, the first periodic signal from the voltage controlled oscillator 111 is not provided directly to the first phase locked loop 113. Instead, the first periodic signal is first provided to a multiplier 201.

The multiplier 201 (shown in FIG. 2 as a doubler such as an EX-OR logic gate) is configured to double the frequency of the first periodic signal before being received by the first phase locked loop 113. This allows phase locked loops having higher minimum locking frequencies than the frequency output by the VCO 111 to be implemented in the signal processing system 200 (e.g. in a FPGA as shown). The multiplier 201 generates an intermediate periodic signal at a multiple, e.g. twice the frequency of the first periodic signal, and outputs this to the first PLL 113. As described in relation to FIG. 1, the first PLL 113 generates a second periodic signal at a multiple k of the frequency of first periodic signal. In the signal processing system 200, the second periodic signal provides a clock signal for the FPGA 203. The second periodic signal is also provided signal to the second PLL 117, and is used as a clock signal by the first and second ADCs 115 and 116 and first and second DACs 118 and 119 in a manner equivalent to that described in relation to the signal processing system 100 shown in FIG. 1.

The second periodic signal is also provided to the divider 205 of the FPGA 203.

The divider 205 is configured to reduce the frequency of the second periodic signal before it is used to set sampling and signal generation rates. In this way, the divider 205 reduces the frequency of the second periodic signal before it is received by the first ADC 115 and the second ADC 116 such that the rate at which signals are sampled from the primary and secondary pickoff transducers 105, 104, can be set as any (lower) frequency that is a factor of the frequency of the second periodic signal. Ideally the sampling rate used for the primary and secondary pickoff signals is set so as to avoid jitter. Similarly, the frequency of the second periodic signal is reduced before it is provided to the first DAC 118 and the second DAC 119 to set the rate at which the drive signal waveforms for the primary drive transducer 103 and secondary drive transducer 106 are generated. Ideally the rate at which the drive signal waveforms are generated is set so as to limit noise.

The FPGA 203 is used to instruct the signal processing system 200 to carry out pickoff and drive operations. The FPGA 203 comprises a counter 207 configured to increment at a rate synchronous to the resonant frequency of the vibrating structure 102 based on the first periodic signal received from the VCO 111. The counter 207 has a maximum value set according to the rate at which primary pick off data is generated by the first ADC 115. When the counter rolls over (i.e. when the maximum value is surpassed), a signal is sent from the FPGA 203 to the digital signal processor 109 indicating that the primary pick off data is ready to be input from the first ADC 115, and that new primary drive data is required by the first DAC 118. In this way, the processing of data relating to the pick off and drive operations of the signal processing system 200 remains synchronous to the resonant frequency.

Figure 3:
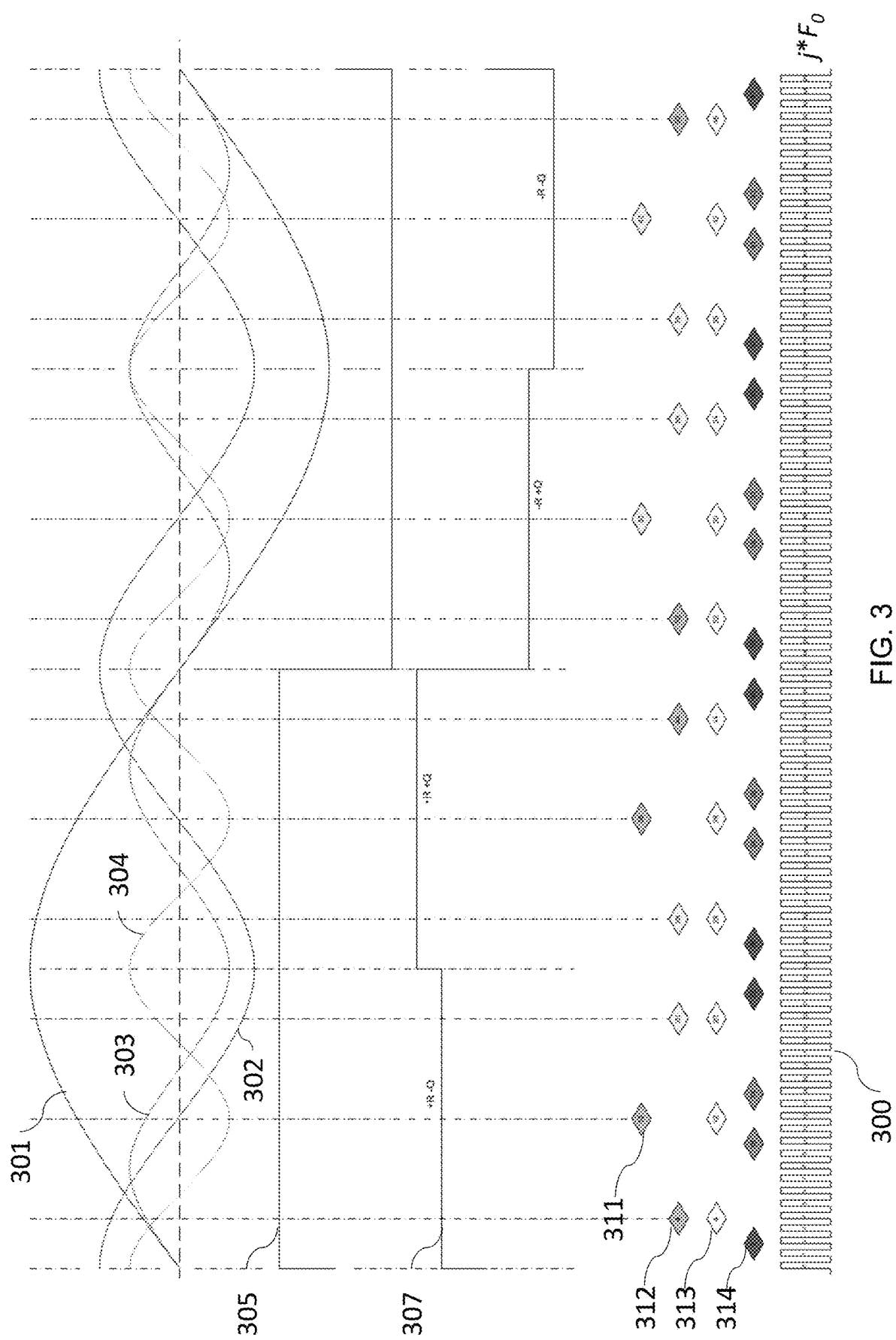
FIG. 3 is a synchronous timing diagram of operations of a signal processing system according to an example of the present disclosure.

FIG. 3—Synchronous Timing Diagram

Having described how the digital processing system disclosed herein allows clock signals and sampling rates to be set synchronous to the resonant frequency of a vibrating structure 102, an example of the timing of operations of the digital signal processing system 100 will now be described with reference to FIG. 3.

FIG. 3 shows a synchronous timing diagram of the operations of the digital processing system 100 shown in FIG. 1. In FIG. 3, an example of the first periodic signal, as output by the VCO 111 at a frequency j*F0 is shown by the line 300.

A signal representative of the resonant frequency as determined from the primary pickoff signal is shown as curve 301, while signals corresponding to the first three harmonics of the resonant frequency (2*F0, 3*F0, 4*F0) are shown as curves 302-304 respectively. The sampling times used by the first ADC 115 to enable identification of the frequency of each of these signals are shown in the sampling times 311-314 respectively. These timings are set relative to the timings of the first periodic signal (shown as 300 in FIG. 3). Thus, if the frequency of the first periodic signal changes (e.g. as a result of the resonant frequency of the vibrating structure 102 changing due to a change in temperature), so too do the times at which the pickoff signals are sampled. In this way, variations in the resonant frequency are automatically accounted for during sampling, reducing the likelihood of phase errors caused by misaligned sampling points.

The timing of the drive signals applied to the primary drive transducer 103 and secondary drive transducer 106 are also shown in FIG. 3, as lines 305 and 307 respectively. In a manner equivalent to that described for the pickoff signals, the timing of the drive signals is also set based on the timings of the first periodic signal, and hence will also change as the resonant frequency of the vibrating structure 102 is varied.

Figure 4:
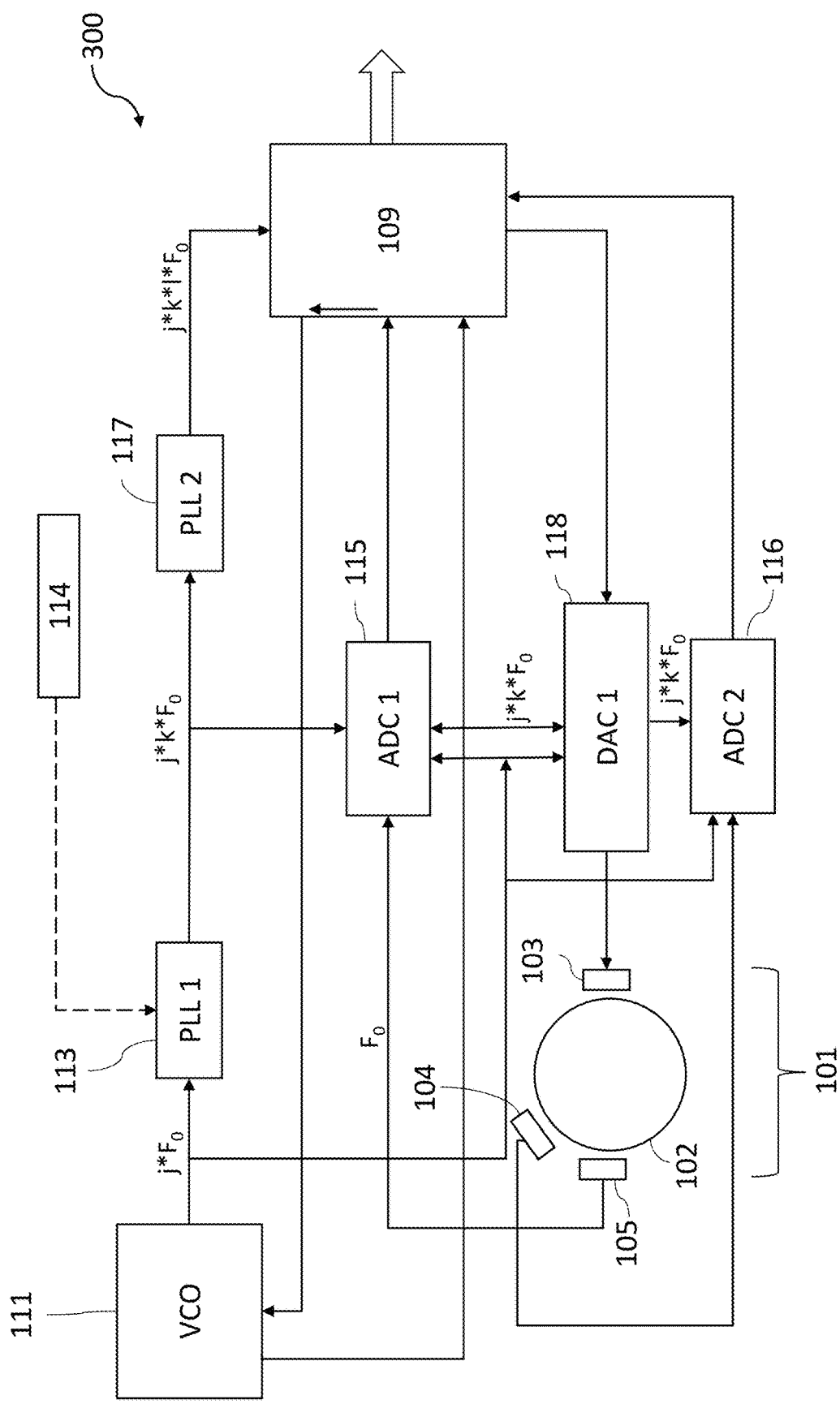
FIG. 4 schematically illustrates a signal processing system for an open loop vibrating structure angular rate sensor according to a second example of the present disclosure.

Although the signal processing system 100 shown in FIG. 1 implements closed-loop operation, an equivalent signal processing system can be applied to open-loop systems. FIG. 4 shows an example of a signal processing system 300 applied to such an open loop system.

As can be seen in FIG. 4, the signal processing system 300 includes all of the components of the signal processing system 100 shown in FIG. 1, with the exception of the secondary drive transducer 103 and the second digital to analogue converter 119. Insofar as the FIG. 4 includes items previously discussed in connection with FIG. 1, the similar items will be given the same reference numbers and not described in detail.

As described in relation to the signal processing system 100 shown in FIG. 1, the signal processing system 300 of FIG. 4 comprises a vibrating structure angular rate sensor 101 driven to oscillate at its natural resonant frequency by a primary drive (PD) transducer 103, and a primary pick off (PPO) transducer 105 configured to detect oscillation of the vibrating structure 102 in the primary mode. The primary drive signals are adjusted by the signal processing system 300 to maintain resonant motion of the vibrating structure 102 as described in relation to the signal processing system 100 shown in FIG. 1. Coriolis-induced vibration is detected using a secondary pick off (SPO) transducer 104, which provides signals representative of the applied angular rate to a digital processing system 109. Unlike the signal processing system 100 shown in FIG. 1 however, no secondary drive transducer is required in the signal processing system 300. Instead of operating in a force-feedback mode in which oscillations in the secondary mode are nulled, said oscillations are simply detected by the secondary pick off (SPO) transducer 104 and processed by the digital signal processing system 109 to calculate the rate of angular motion experienced by the vibrating structure angular rate sensor 101 around the axis of rotation of the vibrating structure 102. Although not shown in FIG. 4, it will be appreciated that by not including a secondary drive transducer, the location of the secondary drive transducer 106 in the closed loop system shown in FIGS. 1 and 2 becomes available for other components, such as an additional secondary pickoff transducer.

Using the secondary drive transducer 106 of the closed loop system shown in FIGS. 1 and 2 as an additional secondary pickoff transducer in this way may allow improved signal to noise in the secondary pickoff signal to be achieved.

In some examples of the system of the present disclosure, the voltage controlled oscillator 111 is not controlled by the digital signal processing system 109, but is instead controlled based on a signal received directly from the primary pickoff transducer 105 without first being processed by the digital processing system 109. This is achieved using an analogue loop filter 120 as will be described in the following in relation to FIG. 5 and can be called Closed Loop—Analogue signal processing.

Figure 5:
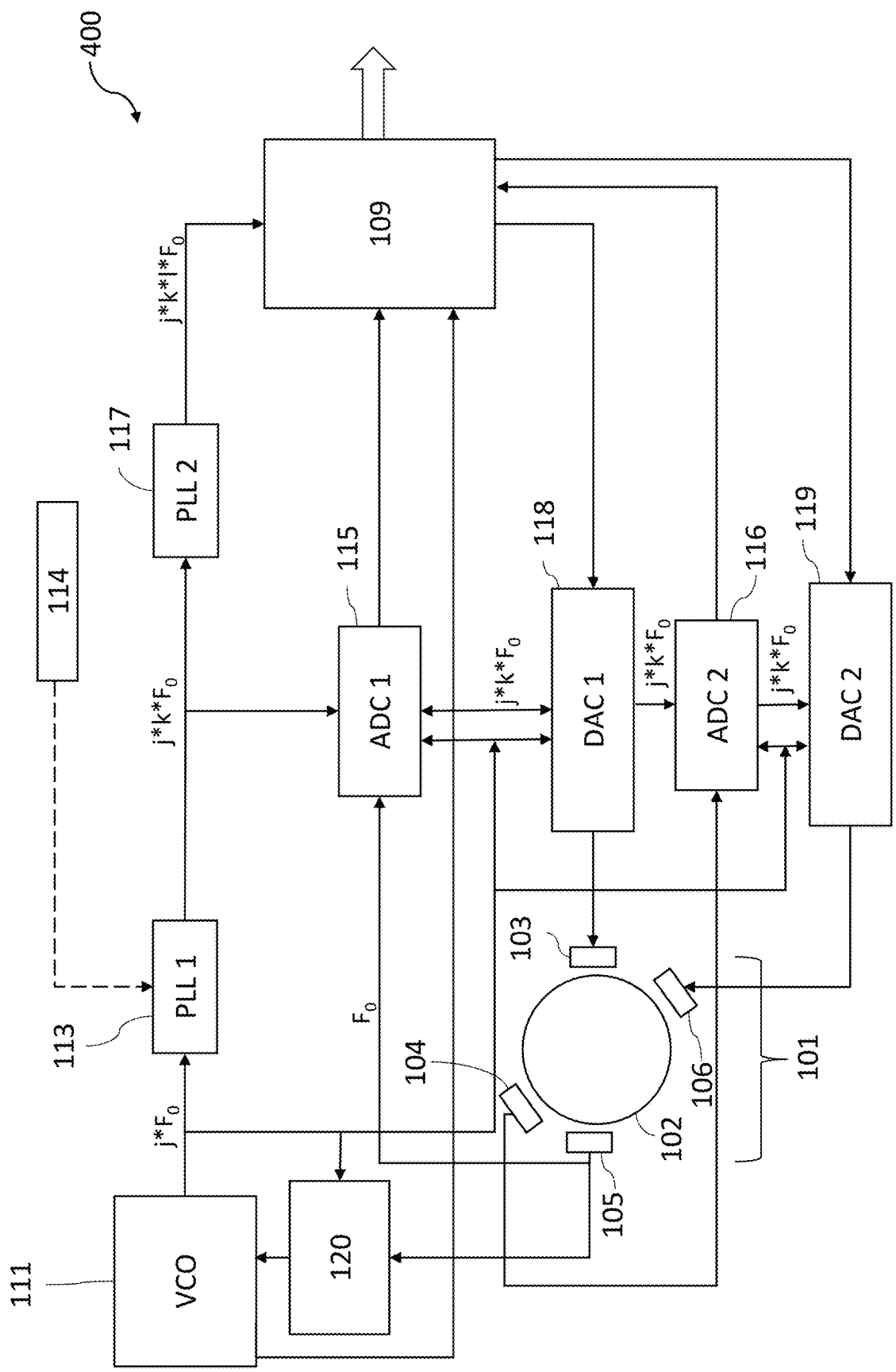
FIG. 5 schematically illustrates a signal processing system for a closed loop vibrating structure angular rate sensor according to a third example of the present disclosure.

FIG. 5 shows a signal processing system 400 for a vibrating structure angular rate sensor 101 according to a fourth example of the present disclosure. The signal processing system 400 shown in FIG. 5 comprises the same components previously described in relation to FIG. 1, but additionally comprises an analogue loop filter 120. In the example shown in FIG. 5, the operating frequency of the voltage controlled oscillator 111 is not set based on an input signal received from the digital signal processing system 109. Instead, the operating frequency of the voltage controlled oscillator 111 is set based on a signal from the analogue loop filter 120.

As described in relation to FIG. 1, the vibrating structure 102 is driven into resonance at the resonant frequency F0 (e.g. 10 KHz), and oscillations of the vibrating structure 102 are detected at a primary pick off transducer 105. The resulting analogue signal is input to the first analogue to digital converter 115 in a manner equivalent to that described above. However, in contrast to the examples shown in FIG. 1, the resulting analogue signal is also provided to the analogue loop filter 120, which generates an output signal to be provided to the voltage controlled oscillator 111. The voltage controlled oscillator 111 then generates the first periodic signal, at a frequency j*F0, based on the signal received from the analogue loop filter 120. The first periodic signal generated by the voltage controlled oscillator 111 is used to set the sampling rate used by the first ADC 115 and the second ADC 116, the rate at which the drive signal waveforms are generated by the first DAC 118 and the second DAC 119, and to generate clock signals for the signal processing system 100, in a manner equivalent to that described in relation to FIGS. 1 and 4.

However, in contrast to the examples shown in FIGS. 1, 2 and 4, the first periodic signal is also output to the analogue loop filter 120, where its phase is compared to that of the signal received from the primary pick off transducer 105 at the resonant frequency, in order to ensure that the first periodic signal remains synchronous to the resonant frequency.

In the event that the resonant frequency varies, e.g. as a result of a temperature change, the analogue loop filter 120 detects a phase difference between the first periodic signal and the signal from the primary pick off transducer 105 at the new resonant frequency, and adjusts the output signal provided to the voltage controlled oscillator 111 in response. This adjustment causes the voltage controlled oscillator 111 to generate the first periodic signal at a multiple of the new resonant frequency j*F0. In this way, the first periodic signal is always synchronous to the resonant frequency, even when the resonant frequency changes, e.g. in response to a temperature change of the vibrating structure angular rate sensor 101.

Figure 6:
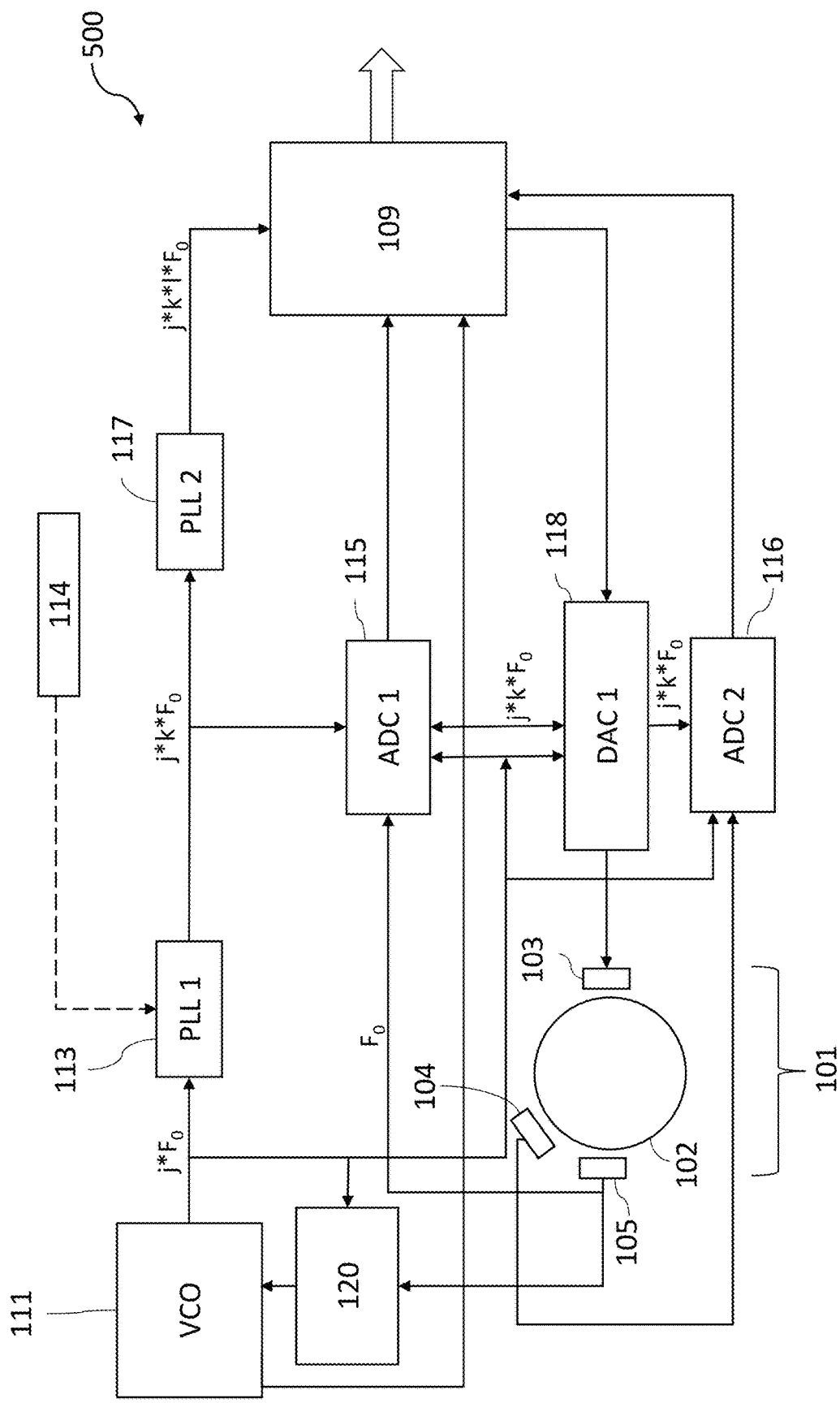
FIG. 6 schematically illustrates a signal processing system for an open loop vibrating structure angular rate sensor according to a fourth example of the present disclosure.

Although the signal processing system 400 shown in FIG. 5 implements closed-loop operation, an equivalent signal processing system including the analogue loop filter 120 can also be applied to open-loop systems. FIG. 6 shows an example of a signal processing system 500 applied to such an open loop system and can be referred to as Open Loop—Analogue signal processing.

As can be seen in FIG. 6, the signal processing system 500 includes all of the components of the signal processing system 400 shown in FIG. 5, with the exception of the secondary drive transducer 106 and the second digital to analogue converter 119 seen in FIG. 5. Insofar as the diagram of FIG. 6 includes items previously described in relation to FIG. 5, the similar items will be given the same reference numbers and not described in detail.

As described in relation to the signal processing system 400 shown in FIG. 5, the signal processing system 500 of FIG. 6 comprises a vibrating structure angular rate sensor 101 driven to oscillate at its natural resonant frequency by a primary drive transducer 103, and a primary pick off transducer 105 configured to detect oscillation of the vibrating structure 102 in the primary mode. The primary drive signals are adjusted by the signal processing system 500 to maintain resonant motion of the vibrating structure 102 as described in relation to the signal processing system 400 shown in FIG. 5. Coriolis-induced vibration is detected using a secondary pick off (SPO) transducer 104, which provides signals representative of the applied angular rate to a digital processing system 109. Unlike the signal processing system 400 shown in FIG. 5 however, no secondary drive transducer is required in the signal processing system 500. As described in relation to the open loop system shown in FIG. 4, instead of operating in a force-feedback mode in which oscillations in the secondary mode are nulled, said oscillations are simply detected by the secondary pick off (SPO) transducer 104 and processed by the digital signal processing system 109 to calculate the rate of angular motion experienced by the vibrating structure angular rate sensor 101 around the axis of rotation of the vibrating structure 102. It will be appreciated that by not including a secondary drive transducer 106, the location of the secondary drive transducer 106 in the closed loop system shown in FIG. 5 becomes available for other components, such as an additional secondary pickoff transducer. Using the secondary drive transducer 106 of the closed loop system shown in FIG. 5 as an additional secondary pickoff transducer in this way may allow improved signal to noise in the secondary pickoff signal to be achieved.

It will be appreciated by those skilled in the art that the present disclosure has been illustrated by describing one or more specific examples thereof, but is not limited to these examples; many variations and modifications are possible, within the scope of the accompanying claims.

The invention claimed is:

1. A signal processing system for a vibrating structure angular rate sensor having a vibrating structure, a primary drive transducer for causing the vibrating structure angular rate sensor to oscillate at a resonant frequency, and a primary pick off transducer for detecting oscillation of the vibrating structure angular rate sensor at the resonant frequency;
wherein the signal processing system comprises:
a digital signal processing system configured to set a drive signal frequency for the primary drive transducer;
a voltage controlled oscillator (VCO) configured to receive an input indicative of the resonant frequency and to generate a first periodic signal at a first multiple of the resonant frequency;
a first phase locked loop, configured to receive the first periodic signal, and to generate a second periodic signal at a second multiple of the resonant frequency, wherein the second multiple is greater than the first multiple;
an analog-to-digital converter (ADC) configured to sample a primary pick off signal from the primary pick off transducer at a first rate set by the first periodic signal and to generate a primary pick off data input to a digital signal processing system, wherein the second periodic signal is used as a clock signal by the ADC when generating the primary pick off data input to the digital signal processing system; and
a digital-to-analog converter (DAC) configured to receive the drive signal frequency from the digital signal processing system at a second rate set by the second periodic signal and to generate a drive signal waveform to be applied to the primary drive transducer, wherein the drive signal waveform is generated at a first rate set by the first periodic signal and the second periodic signal is used as a clock signal by the DAC when generating the drive signal waveform.

2. The signal processing system of claim 1, further comprising:
a second phase locked loop, configured to receive the second periodic signal and to generate a third periodic signal at a third multiple of the resonant frequency, wherein the third multiple is greater than the second multiple;
wherein the third periodic signal is used as a clock signal by the digital signal processing system during computation to set the drive signal frequency synchronously with the resonant frequency.

3. The signal processing system of claim 1, wherein the digital signal processing system is configured to set a secondary drive signal frequency for a secondary drive signal to be applied to a secondary drive transducer by a second digital-to-analog converter (DAC).

4. The signal processing system of claim 1, wherein the primary pick off data input to the digital signal processing system is used to provide the input indicative of the resonant frequency from the digital signal processing system to the VCO based on comparing the resonant frequency with the first periodic signal.

5. The signal processing system of claim 1, further comprising:
a loop filter configured to receive the primary pick off signal at the resonant frequency from the primary pick off transducer and the first periodic signal from the VCO, and to provide the input indicative of the resonant frequency to the VCO based on comparing the resonant frequency with the first periodic signal.

6. The signal processing system of claim 1, further comprising:
a field programmable gate array (FPGA) comprising the first phase locked loop, wherein the second periodic signal is used as a clock signal by the FPGA.

7. The signal processing system of claim 6, wherein the FPGA comprises a counter having a maximum value, wherein the increment rate of the counter is synchronous with the resonant frequency of the vibrating structure angular rate sensor.

8. The signal processing system of claim 1, further comprising:
a multiplier configured to multiply the frequency of the first periodic signal before being received by the first phase locked loop.

9. The signal processing system of claim 1, further comprising:

a divider configured to reduce the frequency of the second periodic signal before being applied by the analog-to-digital converter (ADC) when sampling the primary pick off signal from the primary pick off transducer.

10. The signal processing system of claim 1, further comprising:
a divider configured to reduce the frequency of the second periodic signal before being applied by the digital-to-analog converter (DAC) when generating a drive signal waveform to be applied to the primary drive transducer.

11. The signal processing system of claim 1, wherein:
in a first mode of operation, the first phase locked loop is connected to an external oscillator so as to verify the frequency of the received first periodic signal; and
in a second mode of operation, the first phase locked loop is disconnected from the external oscillator.

12. A vibrating structure angular rate sensor comprising the signal processing system of claim 1.

13. The vibrating structure angular rate sensor of claim 12, comprising a MEMS ring resonator structure.

* * * * *